United States Patent [19]

Black et al.

[11] Patent Number: 5,258,710
[45] Date of Patent: Nov. 2, 1993

[54] CRYOGENIC PROBE FOR NMR MICROSCOPY

[75] Inventors: Robert D. Black, Charlton; Peter B. Roemer, Schenectady; Antonio A. Mogro-Campero, Niskayuna; Larry G. Turner, Schenectady, all of N.Y.

[73] Assignee: General Electric Company, Schenectady, N.Y.

[21] Appl. No.: 858,924

[22] Filed: Mar. 27, 1992

[51] Int. Cl.$^5$ .............................................. G01R 33/20
[52] U.S. Cl. ..................................... 324/309; 324/307
[58] Field of Search ................ 335/216, 299; 324/300, 324/307, 309, 318, 319, 320, 322

[56] References Cited

U.S. PATENT DOCUMENTS

| 4,509,030 | 4/1985 | Vermilyea | 335/216 |
|---|---|---|---|
| 4,667,174 | 5/1987 | MacKinnon et al. | 335/299 |
| 4,694,269 | 9/1987 | Burnett et al. | 335/216 |
| 4,924,185 | 5/1990 | Matsutani | 324/319 |
| 5,136,243 | 8/1992 | Starewicz et al. | 324/318 |

OTHER PUBLICATIONS

R. Black, P. Roemer, W. Edelstein, S. Souza, A. Mogro-Campero and L. Turner, "Scaling Laws and Cryogenic Probes for NMR Microscopy", proceedings of the 10th Annual Conference of the Soc. of Magn. Reson., Aug. 10-16, 1991, p. 1250.

J. Johnson, "Thermal Agitation of Electricity in Conductors", Physical Review, vol. 32, Jul. 1928, pp. 97-109.

P. Styles, N. Soffe, C. Scott, D. Cragg, F. Row, D. White and P. White, "A High-Resolution NMR Probe in Which the Coil and Preamplifier are Cooled with Liquid Helium", Journal of Magnetic Resonance 60, pp. 397-404, 1984.

A. Hall, N. Alford, T. Button and D. Gilderdale, "Improvements in High Temperature Superconductor Receiver Coils", Proceedings of the 10th Annual Conference of the Soc. of Magn. Reson. in Med., Aug. 10-16, 1991, p. 725.

A. Mogro-Campero and L. Turner, "Lower Temperature Post-Annealing of Thin Films of $YBa_2Cu_3O_7$ at Lower Oxygen Partial Pressure", Appl. Phys. Lett. 58(4), Jan. 28, 1991, pp. 417 and 418.

M. Reynolds, "Resonant Recombination of Atomic Hydrogen and Deuterium at Low Temperatures", Thesis, The University of British Columbia, Feb. 1989, pp. 35-40.

Primary Examiner—Michael J. Tokar
Attorney, Agent, or Firm—Lawrence P. Zale; Marvin Snyder

[57] ABSTRACT

An apparatus for microscopic imaging employing nuclear magnetic resonance is constructed from a cryogenic probe which is situated in a conventional magnetic resonance imaging system. The cryogenic probe employs a number of chambers and cryogenic liquids which cool a superconductor resonator to very low temperatures. A sample tube for containing a small specimen is heated to a temperature above its freezing point by flowing nitrogen gas over the specimen. A secondary resonant circuit is inductively coupled to the superconducting resonator. A transceiver passes RF signals to be transmitted into the specimen through the secondary resonant circuit causing the superconducting resonator to transmit the RF signal into the specimen. The resonator then acts as a receive coil and receives a signal from the specimen which is inductively passed to the secondary resonator circuit from which an image is generated. The use of superconductors having low resistance and low temperatures causes noise to be significantly reduced, and the signal-to-noise ratio to be substantially increased.

20 Claims, 11 Drawing Sheets

CRYOGENIC PROBE FOR NMR MICROSCOPY

BACKGROUND OF THE INVENTION

1. Field of the Invention

This invention relates to nuclear magnetic resonant microscopy and more specifically to nuclear magnetic resonant microscopy employing a superconducting resonator for coupling signals to and from a speciment for examination.

2. Description of Related Art

In any imaging experiment, the signal-to-noise ratio (SNR) determines the limits of resolution. For whole body magnetic resonance imaging (MRI) at a field strength of 1.5 Tesla, it is the subject being imaged, i.e., the patient, who contributes most of the noise to the image. As the dimensions of the subject and RF coil are reduced, a point is reached at which the RF coil contributes more to the total noise than the subject. This point is dependent upon field strength, geometry, etc. and other factors described in *Scaling Laws and Cryogenic Probes for NMR Microscopy* by Black et al., pg. 1250, Proceedings of the 10th Annual Conference of the Soc. of Magn. Reson. in Med., held in San Francisco, Calif. Aug. 10–16, 1991. In the case of nuclear magnetic resonance microscopy (NMRM), it is the thermal or Johnson noise of the RF coil that dominates. Thus, it is the Johnson noise of the RF coil that currently limits the SNR of NMRM.

The theoretical underpinnings of Johnson noise are well established, as described in *Thermal Agitation of Electricity in Conductors* by J. B. Johnson, Physical Review, Jul. 1928. The two parameters that determine the magnitude of Johnson noise, and which are under the control of the experimenter, are resistance (R) of the RF coil, and temperature (T). There have been earlier attempts to cool conventional metal coils to reduce Johnson noise as described in *A High-Resolution NMR Probe in Which the Coil and Preamplifier Are Cooled With Liquid Helium* by Styles et al., J. Mag. Res., 60, pp. 397–404 (1984).

Reducing the resistance of the RF coil has been accomplished in the past by taking advantage of the decrease in resistance of normal metals (e.g., copper) with decreasing temperature. A much greater reduction is realized with the use of superconducting metals.

Bulk, polycrystalline $Y_1Ba_2Cu_3O_7$ (YBCO) superconductor has been used to produce a crude head coil resonator for whole body imaging as described in *Improvements in High Temperature Superconductor Receiver Coils* by Hall et al., pg. 725, Proceedings of the 10th Annual Conference of the Soc. of Magn. Reson. in Med., held in San Francisco, Calif. Aug. 10–16, 1991. The quality factor Q of this coil was not substantially better than a resonator employing copper. Also, this coil cannot properly function in high-field imaging.

Currently there is a need to reduce the noise in NMRM, and increase the signal-to-noise ratio in order to provide microscopic images.

OBJECTS OF THE INVENTION

It is an object of the present invention to produce high-quality nuclear magnetic resonance (NMR) images of microscopic structures in a specimen much more quickly than conventional methods allow.

It is another object of the present invention to provide nuclear magnetic resonance (NMR) microscopic images having a greater signal-to-noise ratio than those produced with conventional methods.

SUMMARY OF THE INVENTION

The present invention performs high-field nuclear magnetic resonance microscopy (NMRM) employing a superconductor resonator held at low temperatures and results in improved images having a greater signal-to-noise ratio (SNR) than previously possible. The invention makes use of a thin-film, coupled-coil superconducting resonator (an LC, inductive/capacitive resonator) and a gas-cooled dewar. Frequency tuning of the resonator is accomplished by an adjustable shunt capacitance (to tune the resonator to a Larmor frequency, being a frequency at which a nuclear magnetic resonance (NMR) response signal is received). Coupling to the superconducting resonator is achieved by transforming its impedance to a high value in a secondary resonator circuit (the inductor in the secondary circuit may be constructed from a non-superconducting metal). This transformation preserves the SNR afforded by the superconducting resonator since the noise of the superconducting resonator is the dominant noise source. The secondary resonator circuit matched to a transceiver having a low-noise preamplifier preserves the gain in SNR.

BRIEF DESCRIPTION OF THE DRAWINGS

The features of the invention believed to be novel are set forth with particularity in the appended claims. The invention itself, however, both as to organization and method of operation, together with further objects, may best be understood by reference to the following description taken in conjunction with the accompanying drawing in which:

FIG. 2c is a cross-sectional view of the cryogenic probe taken in the portion shown in FIG. 2a.

FIGS. 2a and 2b are connected.

FIG. 4b is a plan view of the resonator of FIG. 4a.

DETAILED DESCRIPTION OF THE INVENTION

Figure 1:
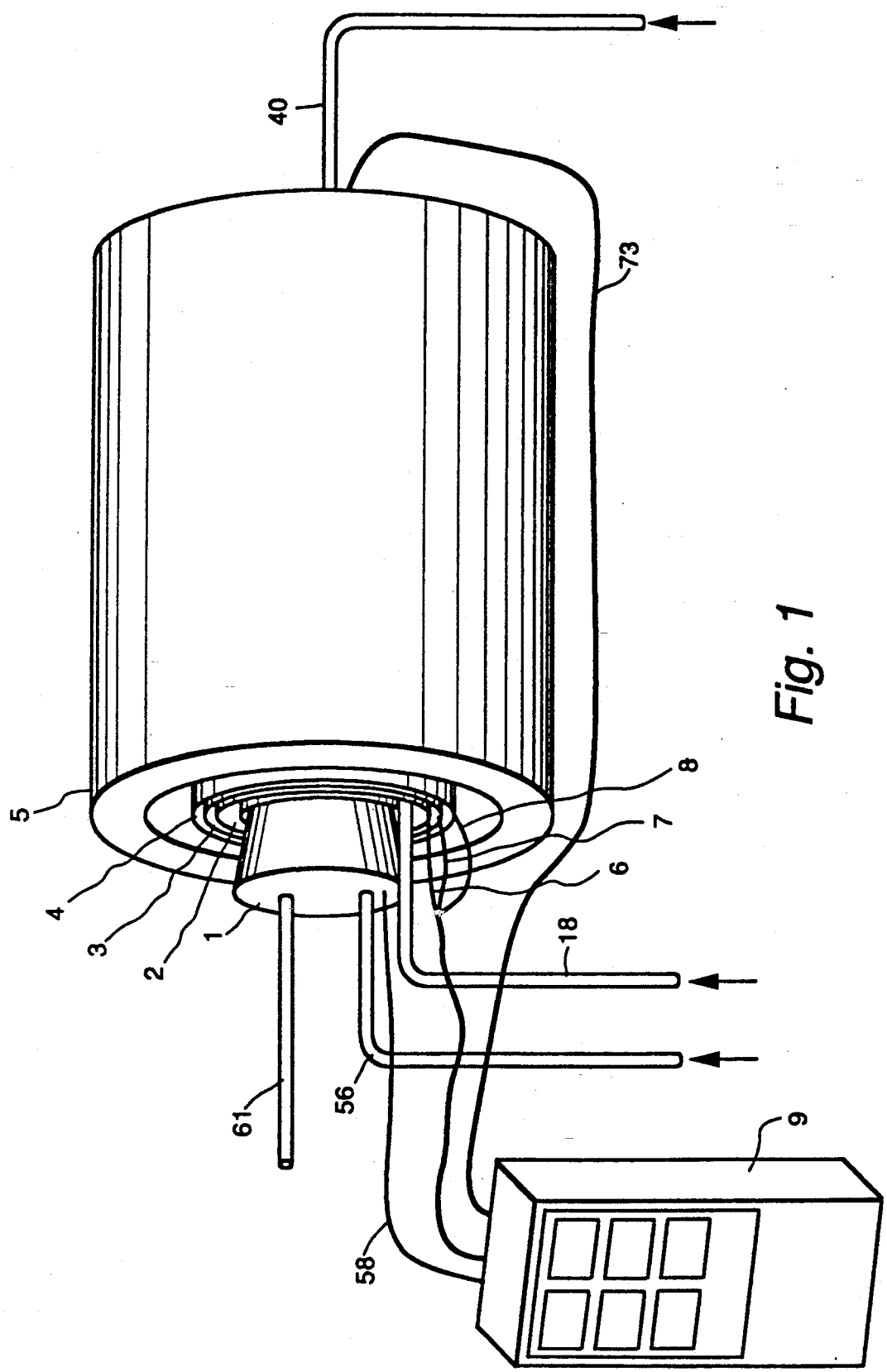
FIG. 1 is a perspective view of the present invention in operation.

The present invention creates high-quality nuclear magnetic microscopy (NMRM) images by reducing both factors which affect the signal-to-noise ratio (SNR) of this type of imaging by a significant amount, i.e., by reducing temperature T, and resistance R. The reduction in temperature is achieved by passing cryogenic gas over a resonator, and insulating the resonator from the ambient environment.

A cryogenic probe 1 having a speciment to be imaged, is placed within a magnetic 5 which produces a homogeneous magnetic field. Gradient coils 2, 3, 4 surround cryogenic probe 1 and fit within the bore of magnet 5. An MR control unit 9 provides current to gradient coils 2, 3 and 4 through lines 6, 7, 8 causing gradient coils 2, 3, 4 to create magnetic fields which add to the magnetic field produced by magnet 5, causing spatial magnetic field gradients in predetermined directions at predetermined times.

Cooled cryogenic gasses are passed into cryogenic probe 1 through tubes 56 and 18. The temperature of the cryogenic gasses is monitored and controlled by MR control unit 9 through line 58. A heated inert gas is introduced through a tube 40 into the end of the cryogenic probe 1. An MR response signal from the specimen is monitored and passed through line 73 to MR control unit 9 to be processed into an image. A rod 61 is manipulated to fine tune an imaging frequency of cryogenic probe 1.

Figure 2A:
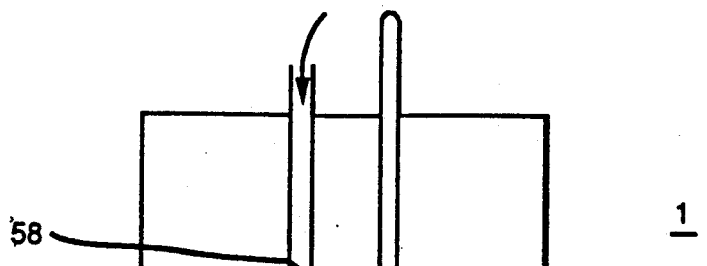
FIGS. 2a and 2b together are a cut-away elevational view of a cryogenic probe of the present invention.
Figure 2A:
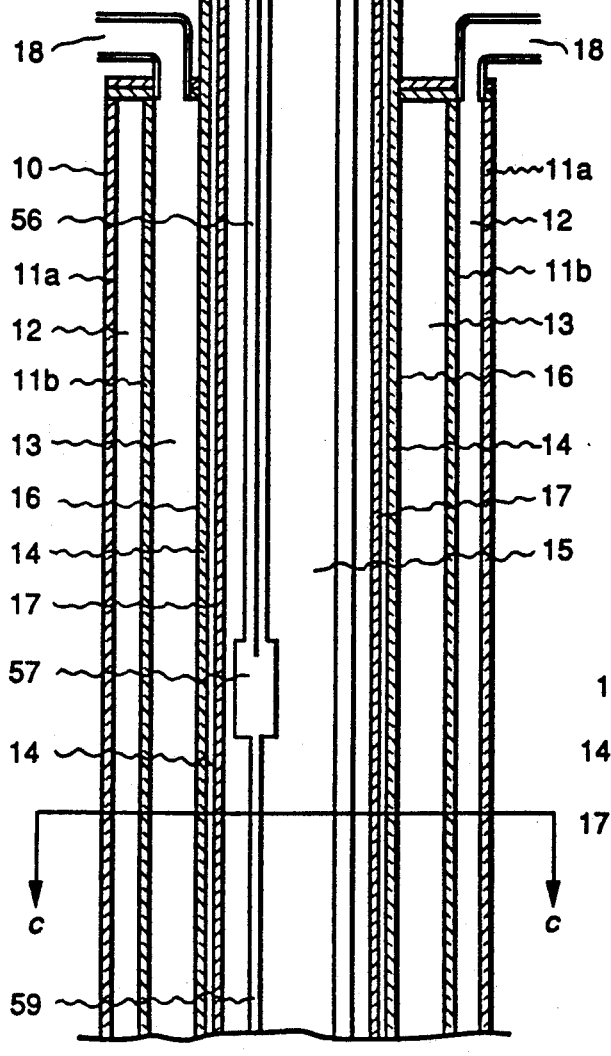
Figure 2C:
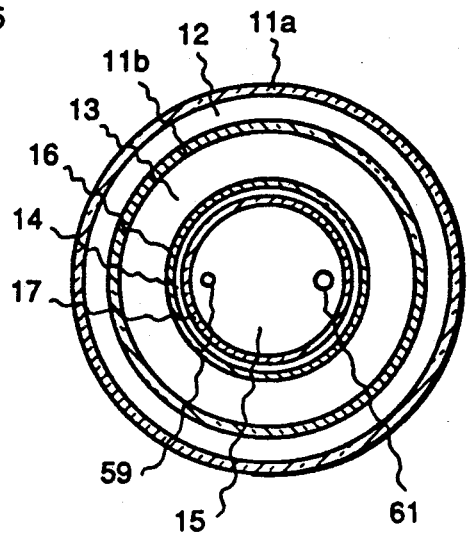
Figure 2B:
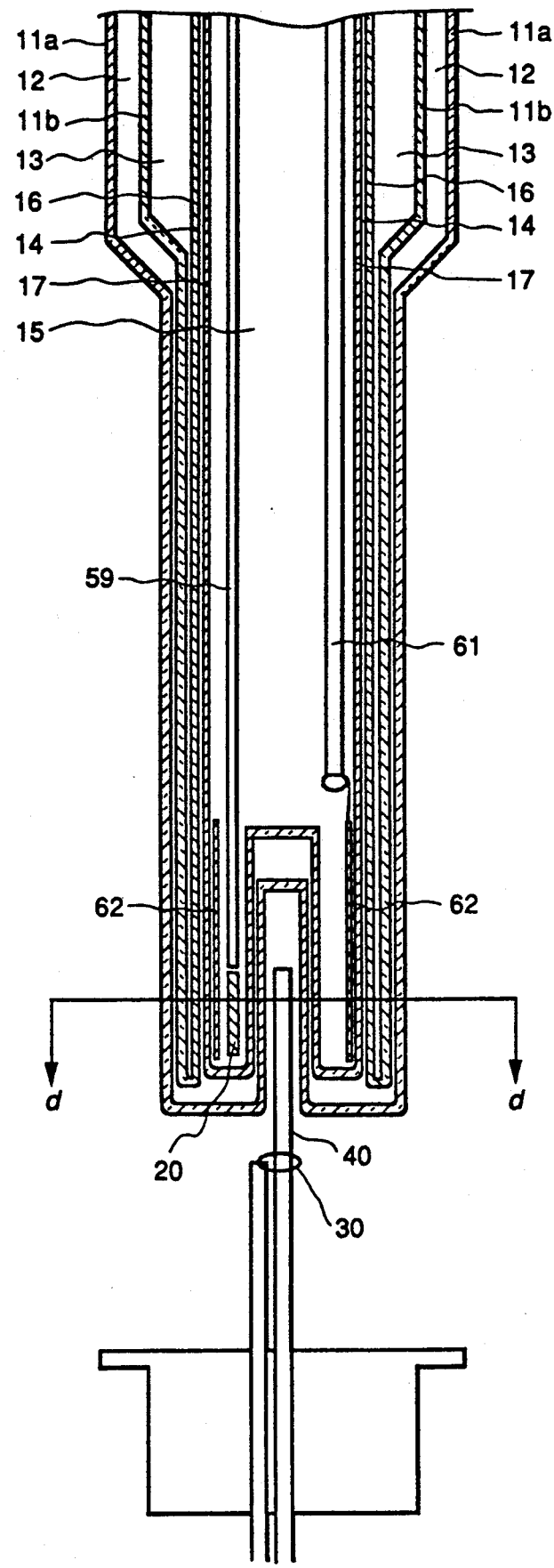
Figure 2D:
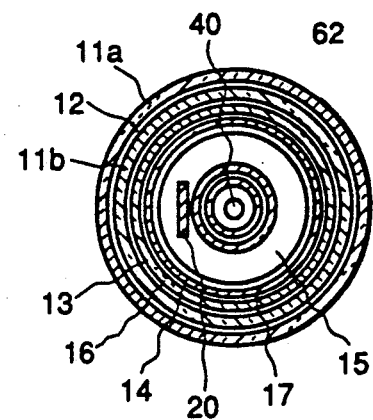
FIG. 2d is a cross-sectional view of the cryogenic probe taken in the portion shown in FIG. 2b.
Figure 2E:
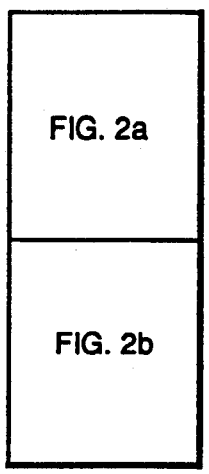
FIG. 2e is a diagram showing how

FIGS. 2a and 2b show cryogenic probe 1 of FIG. 1 having a dewar 10. Dewar 10 fits into a conventional NMR imaging system as shown in FIG. 1. In order to produce large magnetic field gradients, the bore sizes of gradient coils 2, 3, 4 of FIG. 1 are relatively small. Thus, probe 1 must fit within that small bore. Dewar 10 is preferably constructed of quartz, which has a very low dielectric loss tangent and does not absorb much RF power. Thus, dewar 10 will not absorb a significant amount of RF power from a resonator 20 (FIGS. 2b and 2d) positioned inside dewar 10. Materials other than quartz could be used provided they did not contribute RF loss and could maintain structural integrity at temperatures near to that of liquid helium. Probe 1, shown in FIG. 2a–2d, has several chambers. Walls 11a and 11b enclose a vacuum chamber 12. A gas insulation chamber 13, between walls 11b and 16, receives a cold gas, such as cooled nitrogen. A second vacuum chamber 14 between walls 16 and 17, separates gas insulation chamber 13 from a central chamber 15. A cold gas, such as helium, is delivered to central chamber 15 through a transfer tube 56 that is fitted with a needle valve to regulate the gas flow. The cold gas (actually liquid gas for low operating temperatures) passes through a copper heating block 57 which encloses a copper cylinder that is wrapped with a heating coil (not shown). A commercial temperature sensor (not shown) monitors the temperature of the cold gas passing through heating block 57 and passes a signal through lines 58 to MR control unit 9 of FIG. 1. The temperature sensor monitors the temperature of the heater with a commercial magnetic-field-insensitive resistor. MR control unit 9 then passes a signal to the heating coil through line 58 to regulate the temperature of the helium. The helium gas leaves copper heating block 57 in a gaseous state and travels down a cooling gas tube 59, preferably made of quartz, and then exhausts onto resonator 20. Resonator 20 can be maintained at temperatures near to that of liquid helium. The use of cryogenic gases in their gaseous state rather than liquid state, eliminates the vibration that is caused by the action of boiling. Addition of a heat reflective coating to the walls of dewar 10, such as "silvering", helps to cut down on radiative heat loss. Care must be taken in silvering not to shield the specimen from the RF magnetic field. If a metallic silvering is used, the silvering is preferably applied in a crosshatch pattern to reduce the effects of electrical currents flowing through the silvering.

Vacuum chambers 12 and 14, and gas insulation chamber 13 shown in FIG. 2c, which is a view of FIG. 2a taken along line c—c, provide a gradation of temperature and insulation in order to maintain the very low temperatures in central chamber 15. Similarly, the concentric chambers 12, 13, 14, and 15 shown in FIG. 2d, which is a view of FIG. 2b taken along line d—d, maintain the low temperature at resonator 20.

Figure 3:
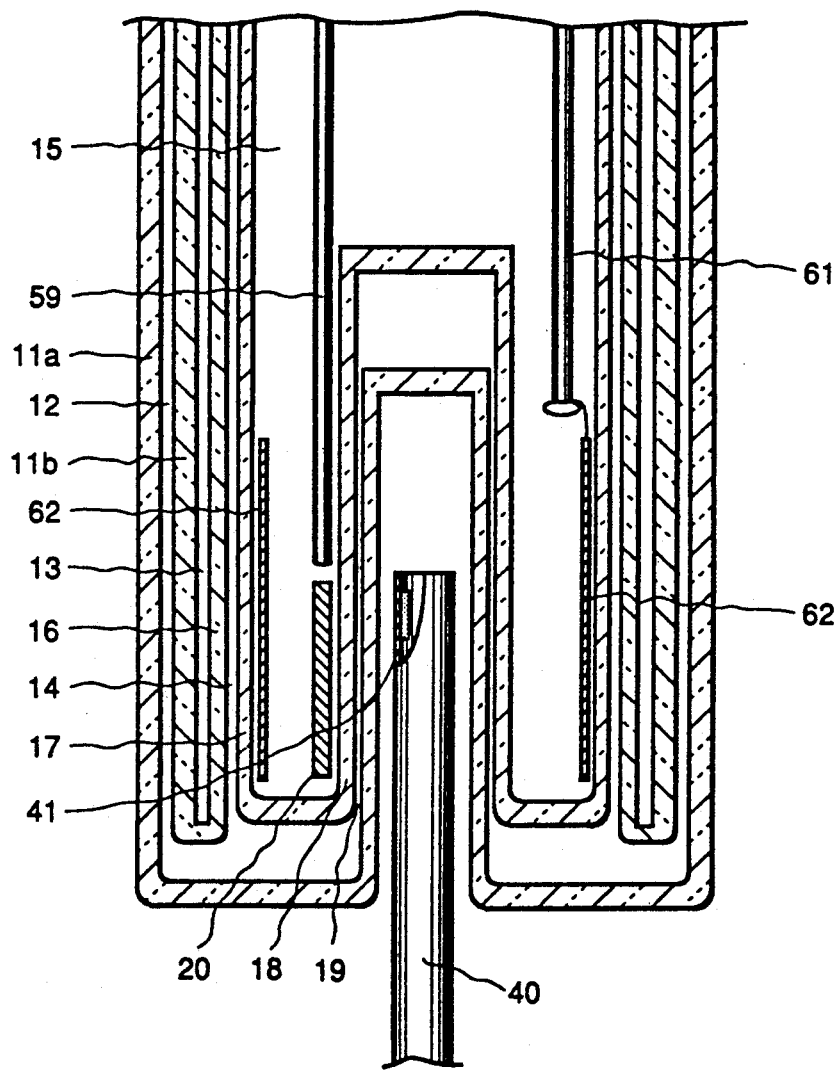
FIG. 3 is an enlarged view of the tip of the cryogenic probe of FIG. 2b.

FIG. 3 is a magnified view of the tip of probe 1. A specimen to be imaged is placed in a sample space 41 in sample tube 40. A 3 mm gap, comprised of quartz and a vacuum space (i.e., a dewar), along with an airspace, exists between the actively warmed ("room temperature") sample space 41 and resonator 20. Resonator 20, constructed of a superconductor material, operates in the temperature range of from 5°–10° Kelvin. Since room temperature is approximately 300 Deg. K., the resonator temperature is approximately a factor of 30–60 less than room temperature. Resonator 20 is positioned close to ($\sim 1$ mm) an innermost wall 18 of central chamber 15. Cooling gas tube 59 is situated directly above resonator 20. Only a vacuum chamber and an air space 19 separates resonator 20 from a room temperature sample tube 40. The total distance from inner helium space 15 to the outer wall of sample tube 40 is about 3 mm. This distance must be large enough to allow for the maintenance of the temperature differential, but needs to be small enough to ensure good inductive coupling between a specimen in sample tube 40 and resonator 20.

Resonator 20 is designed to have a high-quality factor Q which also causes it to have a narrow resonance bandwidth. In order to center the resonant frequency at the Larmor frequency, a fine tuning element is required. A sliding copper cylinder 62 surrounding resonator 20 in central chamber 15 serves, by capacitive coupling, as a frequency adjustment element. A rod 61, preferably of quartz, is attached to copper cylinder 62 to allow it to be moved longitudinally, enabling precise frequency shimming.

Reducing the temperature of the RF coil must be achieved while maintaining a "room temperature" region for the specimen. This is because liquid water (or similarly protonated liquids) is necessary for imaging biological tissues. (Solids or other nuclei may be imaged with the present invention. It is for illustrative purposes that biological specimens are described.) Sample tube 40 requires active warming to prevent the condensation of water and to ensure that the specimen temperature does not drop below its freezing point. A specimen is placed into a sample space 41 at the tip of sample tube 40. Sample space 41 does not fill the entire width of sample tube 40, and a warm gas, preferably heated nitrogen gas, flows through tube 40 past sample space 41 heating the specimen. The gas is warmed by passing it through a coil that is situated in a temperature controlled over (not shown). The entire magnet bore is flooded with nitrogen gas to prevent the condensation of water.

There are some relevant properties of superconductors that must be considered before integrating them into an NMR experiment. The first is that the elemental superconductors cannot withstand magnetic field strengths in excess of about 0.2 Tesla (this is for Nb, the most robust). The A-15 class of superconductors and the high temperature superconductors (HTS) have a much better field tolerance. Another factor to consider is that superconductors are only truly resistanceless with D.C. current. Signals in the GHz frequency range cause the superconductors to exhibit some resistance. However, the frequencies encountered in NMR are all in the sub-GHz region, and so the resistance incurred in the superconductor is much less than that of normal metals.

Another quality that the superconductor must possess to be used for NMR is a high critical current density. If a superconductor is made to carry too much current, it will revert to its normal state. In the case of the HTS materials, for instance, the single crystal film is used to yield a high critical current density (although there has been some work aimed at using the less capable bulk form of HTS for whole body imaging Hall et al., 1991 SMRM, pg. 725.).

Finally, it is obvious that a superconductor coil must be kept below its superconducting transition temperature in order to function. If the temperature of the superconductor is too close to its transition temperature, its properties will be degraded. Clearly the HTS materials have an advantage here.

Figure 4A:
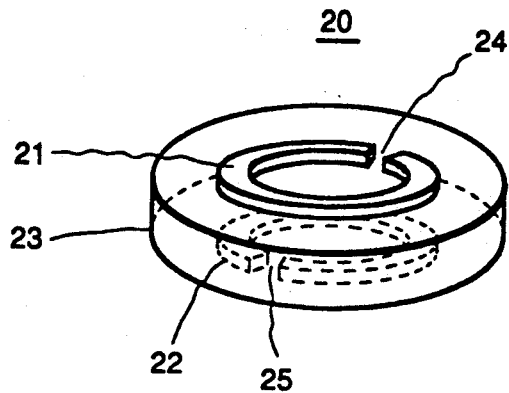
FIG. 4a is a three-dimensional view of one embodiment of the resonator of the present invention.
Figure 4B:
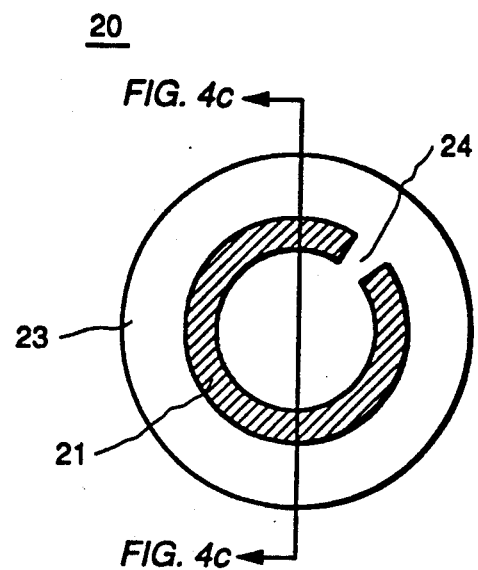
Figure 4C:
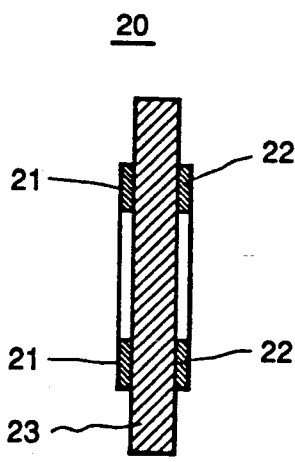
FIG. 4c is a cross-sectional view of the resonator of FIG. 4b.

Using a superconducting material in resonator 20 allows for smaller specimen size or larger specimen-to-coil separations (the latter being important in situations where the coil causes susceptibility perturbations). FIG. 4a is a three-dimensional view of resonator 20. Resonator 20 has two C-shaped rings 21, 22 which act as coils, each comprised of a superconductor material and preferably a High Temperature superconductor such as $Y_1Ba_2Cu_3O_7$ (YBCO). A number of rare earth metals such as Europium, Dysprosium, Holmium and Erbium may replace Yttrium, Y, in the above composition and are equally applicable for use in the present invention. One ring is disposed on the front and the other on the back of a wafer 23, preferably comprised of lanthanum aluminate. A pair of gaps 24, 25 are cut in rings 21, 22 such they are 180 degrees apart with respect to each other. Rings 21, 22, by their construction, are thus capacitively and inductively coupled. The size of rings 21, 22 and the thickness of wafer 23 are chosen to cause resonator 20 to resonate at a frequency that will be close to the Larmor frequency. In the present case, the Larmor frequency is 300 MHz and the outer diameter of rings 21, 22 is 18 mm. The width of rings 21, 22 is 2 mm. The thickness of wafer 23 is 20 mils. Lanthanum aluminate is chosen for its relatively low loss tangent and because of the fact that good quality YBCO films can be grown on it. The thickness of rings 21, 22 is roughly 0.6 micrometers and is limited by a loss of crystalline alignment at greater thicknesses. Rings 21, 22 can be created using standard photolithographic techniques. The details of the deposition parameters of the YBCO films are the subject of *Lower Temperature Post-Annealing of Thin Films of $YBa_2Cu_3O_7$ at Lower Oxygen Partial Pressure* by A. Mogro-Campero and L. G. Turner, Appl. Phys. Lett. 58 (4), Jan. 28, 1991. FIGS. 4b and 4c, respectively, are a plan view and a cross sectional view of the embodiment of resonator 20 shown in FIG. 4a. Resonator 20 of FIGS. 4a, 4b and 4c is an LC resonator and only illustrates one embodiment of the coil geometry of the present invention.

Figure 4D:
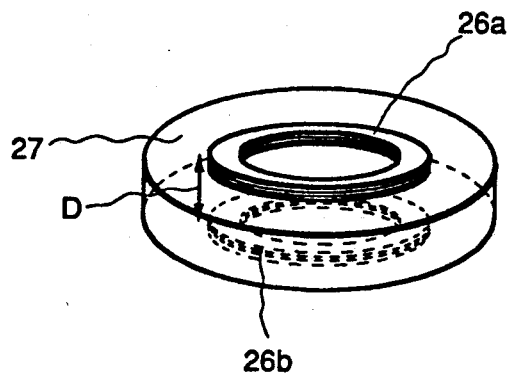
FIG. 4d is a three-dimensional view of a second embodiment of the coils of the resonator employing a Helmholtz pair coil arrangement.

Another geometry for the coils of resonator 20 may be a Helmholtz pair arrangement as shown in FIG. 4d. Superconducting material is disposed on substrate 27 in the form of two loops 26a, 26b, each having at least one turn. Loops 26a, 26b are separated a distance D from each other by a non-conducting material, to cause them to be capacitively coupled. By adjusting the capacitance and inductance of loops 26a, 26b, the Helmholtz pair of FIG. 4d will resonate at a desired frequency.

Figure 4E:
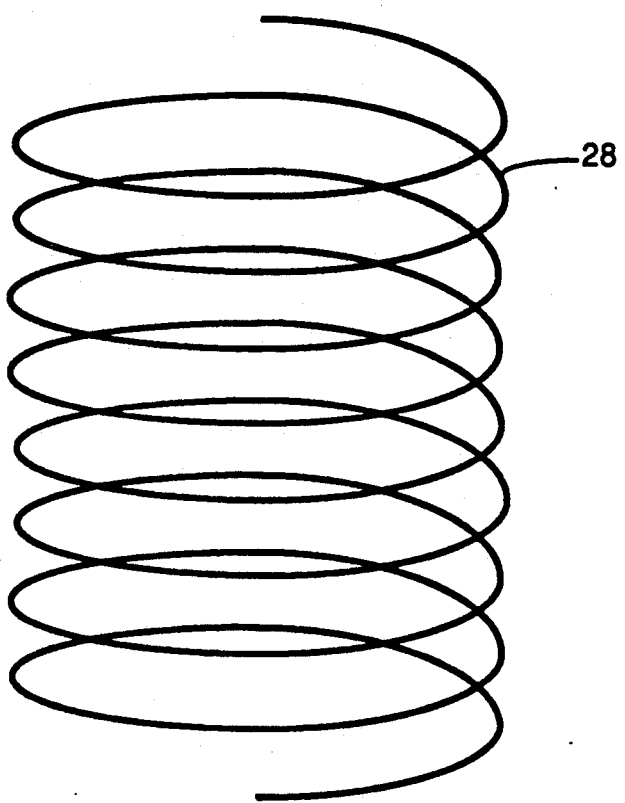
FIG. 4e is a three-dimensional view of a third embodiment of the coils of the resonator employing a solenoid coil arrangement.

Another geometry for the coils of resonator 20 may be a solenoid coil shape as shown in FIG. 4e. Superconducting material is arranged to form a spiral coil 28. When coil 28 is connected to a proper capacitance, it is capable of resonating at a desired frequency.

Figure 4F:
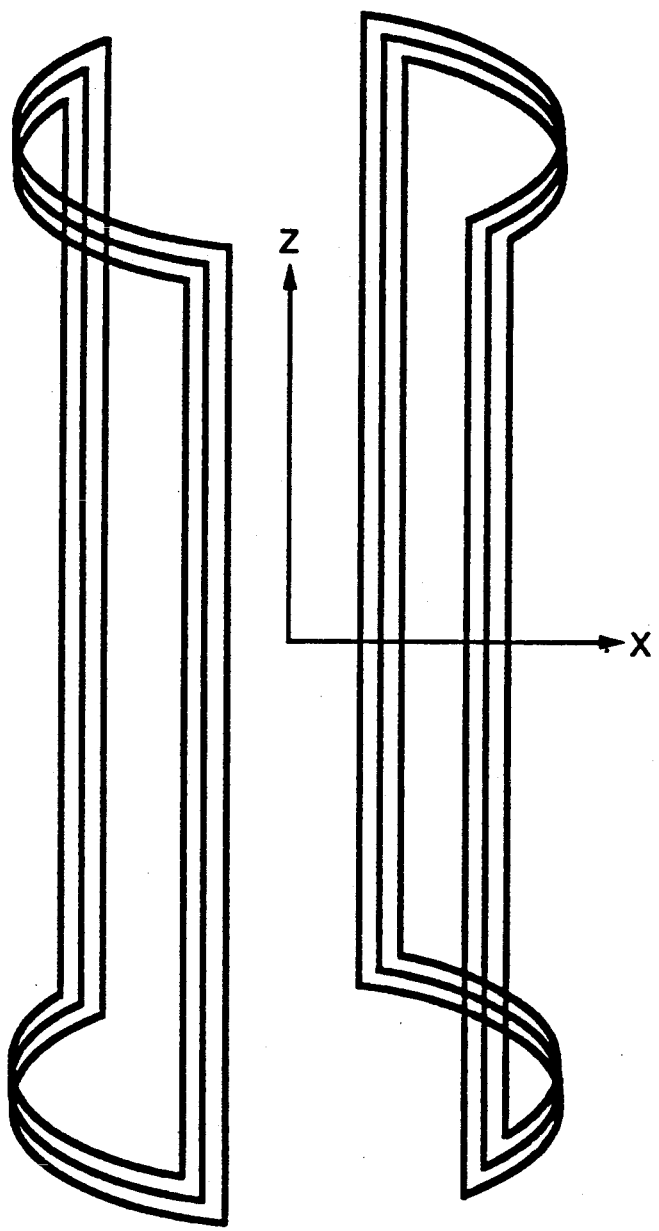
FIG. 4f is a three-dimensional view of a fourth embodiment of the coils of the resonator employing a saddle-shaped coil arrangement.

A saddle-shaped coil, such as that shown in FIG. 4f, may also be used with a proper capacitance (not shown) as resonator 20. Coils 31 and 32 are constructed of a superconductor material.

Figure 4G:
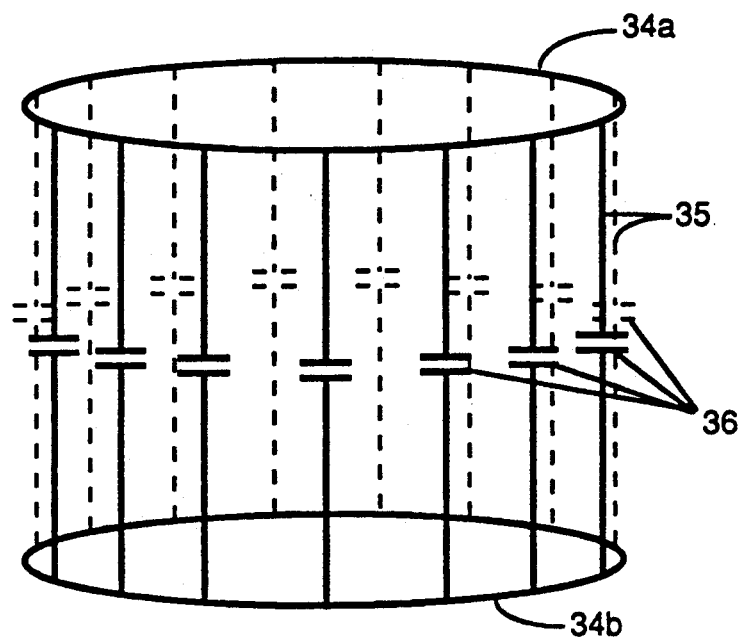
FIG. 4g is a three-dimensional view of a fifth embodiment of the resonator employing a "birdcage" configuration.

Still another geometry for resonator 20 is shown in semi-schematic form as a "birdcage" coil shape in FIG. 4g. End rings 34a, 34b are connected by a number of segments 35, each including a respective capacitor 36. The rings 34a, 34b, segments 35, and capacitors 36 collectively form a resonating LC circuit tuned to a desired resonant frequency. The differences between the coil geometries of FIGS. 4a–4g is that the radiation pattern and receiving sensitivity patterns differ. Each is respectively useful in a different type of application.

Figure 5:
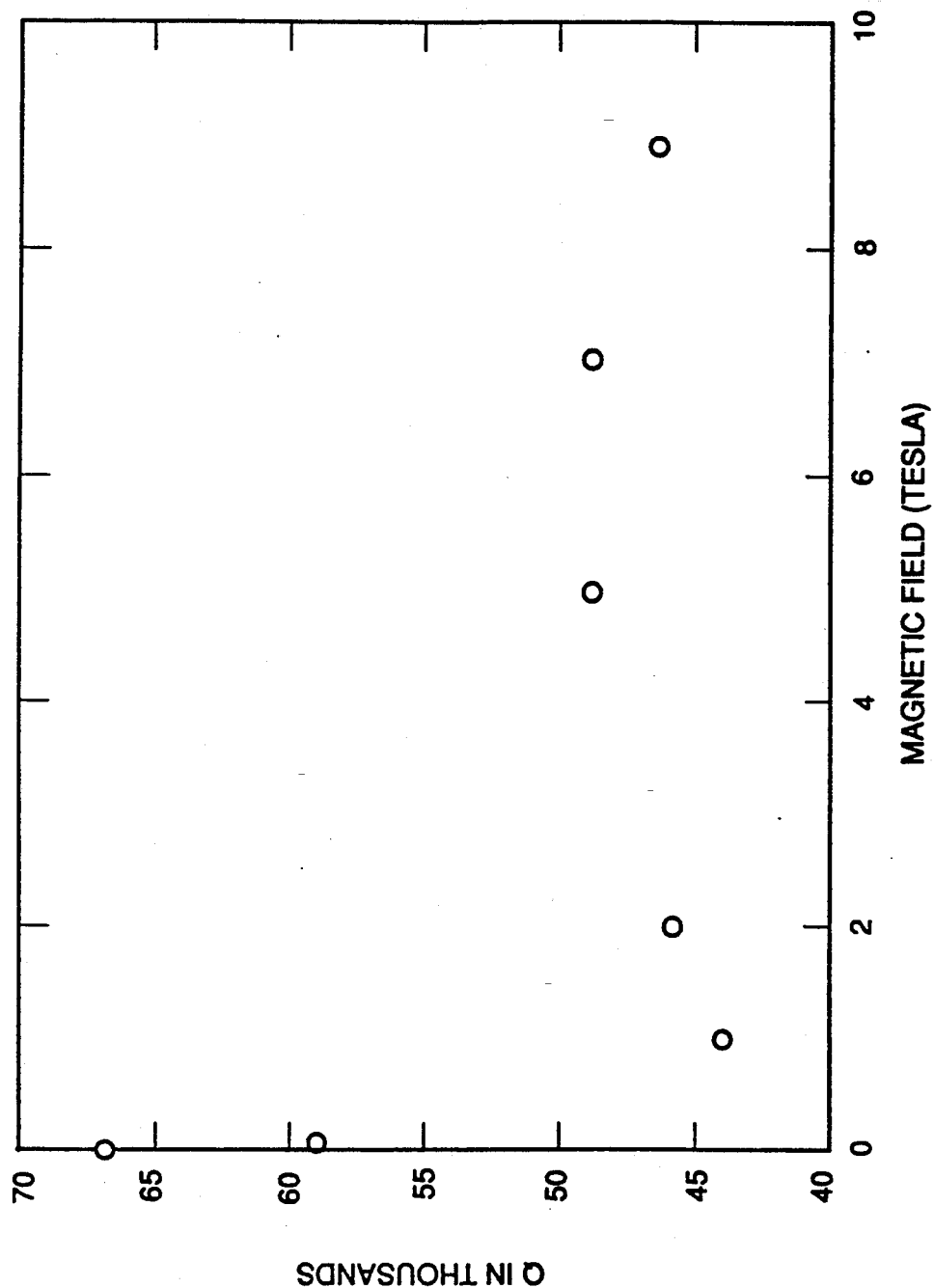
FIG. 5 is a graph of the quality factor Q of the resonator of the present invention with varying magnetic field strength.

The quality factor Q of a resonator is a measure of the effective resistance of that resonator. The Q of a YBCO resonator 20 as shown in FIGS. 4a, 4b, 4c, is shown in FIG. 5 for differing magnetic field strengths. At about 7 Tesla and a 300 MHz Larmor frequency, the Q for resonator 20 is about 48,000. The Q of a copper coil of the same geometry (at room temperature) is about 200–400. (It should be noted that the Q values in FIG. 5 are representative of what we have achieved thus far and do not constitute an intrinsic limit.)

The SNR varies as the square root of the product of Q and 1/T; that is, $$SNR \, \alpha \, \sqrt{Q\left(\frac{1}{T}\right)}.$$

Thus we can realize SNR gains of nearly 100 as compared with an identically sized, room temperature coil. This gain in SNR equates to increased resolution or a reduction in image acquisition time. The reduction in image acquisition time is proportional to the inverse of the square of the SNR, or $$IMAGING \, TIME \, \alpha \, \frac{1}{(SNR)^2}.$$

Figure 6:
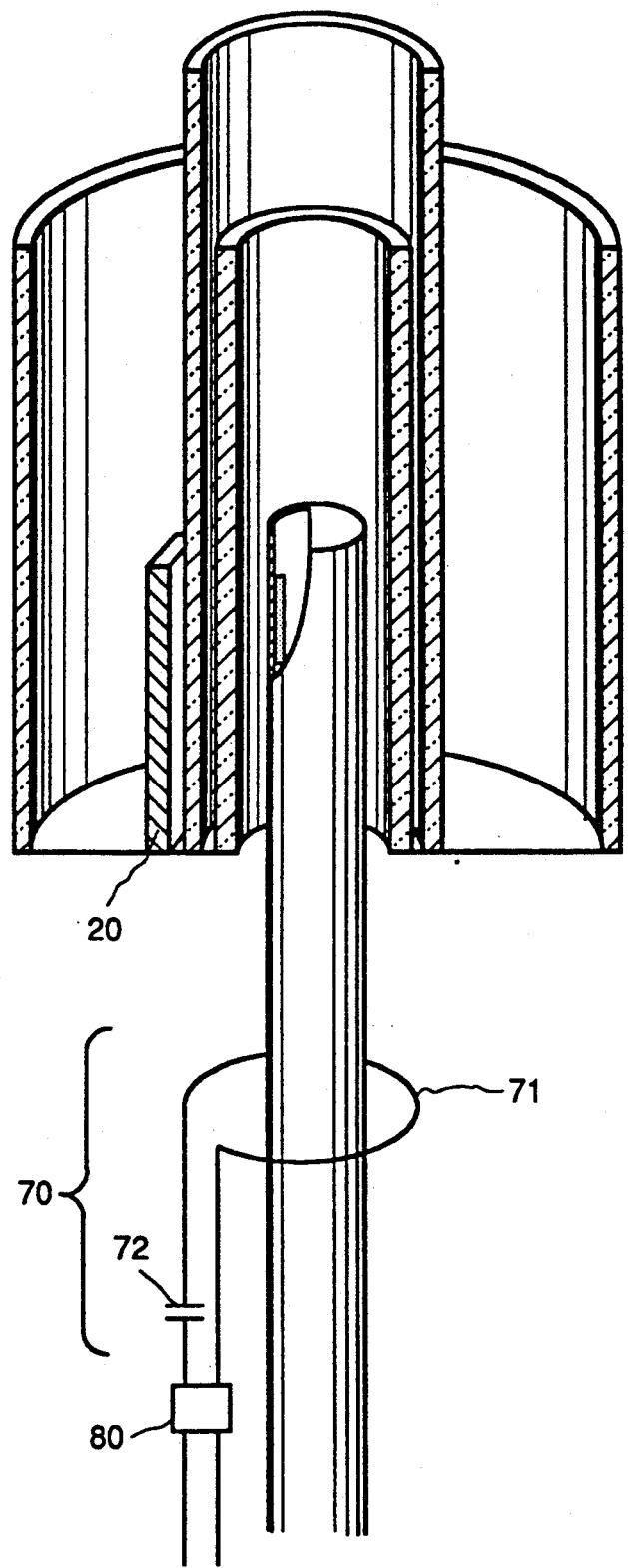
FIG. 6 is an enlarged view of the tip of the cryogenic probe of FIGS. 2a and 2b, illustrating the secondary resonance circuit.

FIG. 6 shows the configuration of a secondary resonator circuit 70. Secondary resonator circuit 70 is inductively coupled to resonator 20 (the primary). The secondary resonator circuit is comprised of a coupling loop 71 and a low-loss capacitor 72. The separation between resonator 20 and coupling loop 71 is adjusted so that the net impedance matches that required by a transceiver 80 in MR control unit 9 of FIG. 1. Transceiver 80 provides an RF signal that is passed to resonator 20, causing it to resonate and transmit RF energy into the specimen. Transceiver 80 also acts as a receiver and receives an MR response signal from the specimen.

Transceiver 80 employs a gallium arsenide (GaAs) field effect transistor (FET) in its input stage. High-electron-mobility transistors (HEMTs) may also be used in an alternate embodiment. The FETs are cooled to reduce their noise contribution by flowing liquid nitrogen through a channelized block onto which a preamplifier of transceiver 80 has been attached. In order to realize the full increase in SNR that is enabled by the primary, it may be necessary to cool secondary resonator circuit 70, preferably in central chamber (15 of FIG. 2b). This will reduce Johnson noise due to coupling loop 71 and capacitor 72. It is also desirable to cool the preamplifier even further by placing it in central chamber 15 (FIG. 2b).

Figure 7:
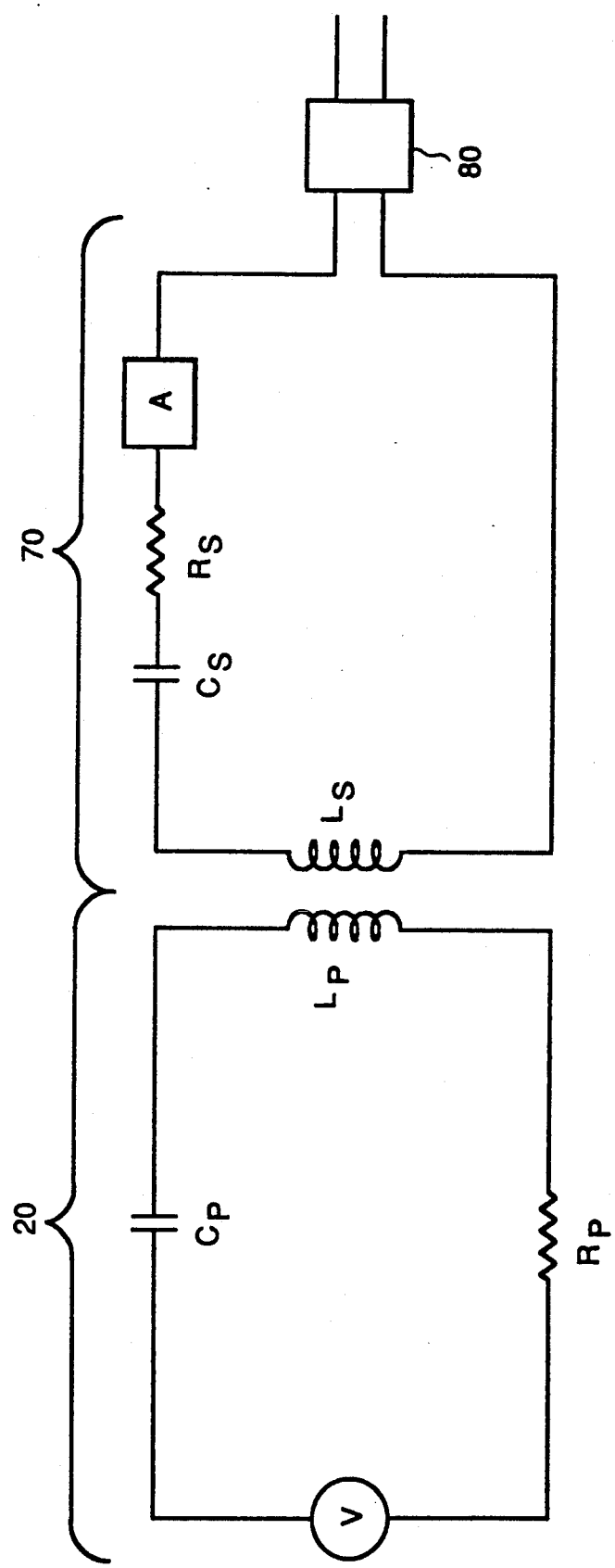
FIG. 7 is a schematic diagram of the resonator and the secondary circuit of the present invention.

FIG. 7 is a schematic diagram of resonator 20 and secondary resonator circuit 70. The impedance $Z_p$ of resonator 20 is transformed to a higher value in secondary resonator circuit 70. This transformed impedance A is made to be much greater than the remainder of the secondary impedance $Z_s$ and thus it dominates the noise in secondary resonator circuit 70. The noise (assumed to be primarily Johnson noise) in resonator 20 is very low due to the low temperature and the low resistance Rp of the superconductor material. The received NMR signal, shown here as voltage source V, is amplified, causing the exceptional SNR of resonator 20 to be translated to secondary resonator circuit 70. It is important that the capacitive reactance $C_p$, and inductive reactance $L_p$, of resonator 20 cancel out. This is ensured by keeping resonator 20 tuned to its resonant frequency (also the Larmor frequency). The cancellation of the capacitive $C_p$, and inductive $L_p$, reactances in secondary resonator circuit 70 keeps the secondary impedance $Z_s$ low so that the transformed primary impedance A dominates the secondary resonant circuit. Thus, $$A = \frac{(\omega M)^2}{Z_p}$$

where
A = the transformed impedance of resonator,
M = mutual inductance between the resonator and the secondary resonance circuit,
$\omega$ = angular frequency,
$Z_p$ = primary impedance.

At resonance, $Z_p = R_p$, and $Z_s = R_s + A$.

Therefore, it is desirable for the transformed primary impedance A to be very large as compared to the secondary resistance $R_s$. This results in a very high signal-to-noise ratio so that NMR microscopy images can be produced with high resolution or more quickly with the same resolution.

While several presently preferred embodiments of the invention have been described in detail herein, many modifications and variations will now become apparent to those skilled in the art. It is, therefore, to be understood that the appended claims are intended to cover all such modifications and variations as fall within the true spirit of the invention.

What we claim is:

1. An apparatus for NMR microscopic imaging of a specimen comprising:
    a) means for providing a static magnetic field;
    b) means for providing gradients to the static magnetic field;
    c) a sample tube for immersion in the magnetic field and magnetic field gradients for holding said specimen;
    d) a resonator having at least one coil constructed of a superconducting material and situated in close proximity to the sample tube, said resonator being tuned to a frequency to transmit radio frequency signals required for resonance of a plurality of nuclei in said specimen and also being tuned to a resonant frequency to receive NMR response signals from said specimen;
    e) means for cooling the superconducting material of the resonator to below its transition temperature a temperature in which the superconductor exhibits low resistance;
    f) means for heating said specimen in the sample tube above the freezing point of liquids in said specimen to be imaged;
    g) insulation means to maintain a temperature difference between said specimen and the resonator;
    h) coupling means for passing a signal to the resonator to cause the resonator to transmit radio frequencies into the specimen and for receiving a signal from the resonator when the resonator is exposed to radio frequencies emitted from the specimen;
    i) an RF transceiver for creating a signal to be passed through the coupling means to the resonator and including a low-noise preamplifier for creating an amplified signal from the signal received from the resonator; and
    j) reconstruction means for reconstructing an image of said specimen from the amplified signal.

2. The apparatus for NMR microscopic imaging recited in claim 1 wherein the resonator comprises a disk shaped substrate, and two superconducting loops each of said loops having a gap and being disposed on the disk shaped substrate such that the loops are parallel to each other and with the gaps being situated 180 degrees apart with respect to each other.

3. The apparatus for NMR microscopic imaging recited in claim 1 wherein the superconductor material of the resonator includes a high temperature superconductor material.

4. The apparatus for NMR microscopic imaging recited in claim 1 wherein the superconductor material of the resonator includes an A-15 type superconductor material.

5. The apparatus for NMR microscopic imaging recited in claim 1 wherein the superconductor material employed in the resonator comprises a thallium class high temperature superconductor material.

6. The apparatus for NMR microscopic imaging recited in claim 1 wherein the superconductor material employed in the resonator comprises a bismuth class high temperature superconductor material.

7. The apparatus for NMR microscopic imaging recited in claim 1 wherein the superconductor material employed in the resonator comprises $XBa_2Cu_3O_7$ where "X" is a rare earth metal selected from the group consisting of: Yttrium, Europium, Dysprosium, Holmium and Erbium.

8. The apparatus for NMR microscopic imaging recited in claim 1 wherein the substrate employed in the resonator comprises one of the group consisting of lanthanum aluminate, magnesium oxide and sapphire.

9. The apparatus for NMR microscopic imaging recited in claim 1 wherein the coil of the resonator comprises one of the group consisting of a Helmholtz pair coil, a birdcage-shaped coil, a solenoid-shaped coil and a saddle-shaped coil.

10. The apparatus for NMR microscopic imaging recited in claim 1 wherein the means for cooling comprises apparatus for conducting low temperature gas to the superconducting material of the resonator.

11. The apparatus for NMR microscopic imaging recited in claim 1 wherein the means for heating comprises apparatus for applying a heated gas over said specimen.

12. The apparatus for NMR microscopic imaging recited in claim 10 wherein the low temperature gas comprises cooled helium gas.

13. The apparatus for NMR microscopic imaging recited in claim 11 wherein the heated gas comprises heated nitrogen gas.

14. The apparatus for NMR microscopic imaging recited in claim 1 wherein the insulation means comprises a chamber filled with a low temperature material enclosing the resonator and the cooling means.

15. The apparatus for NMR microscopic imaging recited in claim 14 wherein the low temperature material comprises cooled nitrogen gas.

16. The apparatus for NMR microscopic imaging recited in claim 14 wherein the insulation means further comprises at least one vacuum chamber enclosing the chamber filled with a low temperature material.

17. The apparatus for NMR microscopic imaging recited in claim 1 wherein the coupling means comprises a wire loop positioned proximate to the resonator and inductively coupled to the resonator.

18. The apparatus for NMR microscopic imaging recited in claim 1 further comprising:
   a) a metal cylinder surrounding the resonator and situated within the means for providing magnetic field gradients; and
   b) an actuating rod affixed to the metal cylinder for adjusting the position of the metal cylinder so as to select a predetermined capacitive coupling between the metal cylinder and the resonator and thereby cause the resonator to resonate at a predetermined frequency.

19. The apparatus for NMR microscopic imaging recited in claim 1 wherein the low-noise preamplifier further is situated to be cooled by said means for cooling so as to reduce thermal noise.

20. The apparatus for NMR microscopic imaging recited in claim 14 wherein the insulation means comprising a chamber is coated with a heat reflective coating to further insulate the cooling means and resonator.

* * * * *